(12) United States Patent
Kim et al.

(10) Patent No.: US 9,455,401 B2
(45) Date of Patent: Sep. 27, 2016

(54) MEMORY DEVICE HAVING A TUNNEL BARRIER LAYER IN A MEMORY CELL, AND ELECTRONIC DEVICE INCLUDING THE SAME

(71) Applicant: SK hynix Inc., Icheon (KR)

(72) Inventors: Wan-Gee Kim, Icheon (KR); Kee-Jeung Lee, Icheon (KR); Hyung-Dong Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/924,342

(22) Filed: Oct. 27, 2015

(65) Prior Publication Data

US 2016/0049582 A1 Feb. 18, 2016

Related U.S. Application Data

(63) Continuation-in-part of application No. 14/167,857, filed on Jan. 29, 2014, now Pat. No. 9,203,019.

(30) Foreign Application Priority Data

Sep. 12, 2013 (KR) .......... 10-2013-0109633

(51) Int. Cl.
*H01L 45/00* (2006.01)
*G11C 13/00* (2006.01)
*G06F 13/16* (2006.01)
*G06F 12/08* (2016.01)
*G06F 13/40* (2006.01)
*H01L 27/24* (2006.01)

(52) U.S. Cl.
CPC .......... *H01L 45/12* (2013.01); *G06F 12/0875* (2013.01); *G06F 13/1673* (2013.01); *G06F 13/4022* (2013.01); *G11C 13/0007* (2013.01); *G11C 13/0021* (2013.01); *H01L 27/2418* (2013.01); *H01L 27/2463* (2013.01); *H01L 27/2472* (2013.01); *G06F 2212/452* (2013.01); *G11C 2213/54* (2013.01); *H01L 45/08* (2013.01); *H01L 45/1233* (2013.01); *H01L 45/146* (2013.01)

(58) Field of Classification Search
CPC ........................... H01L 45/12; G06F 12/0875
USPC ......................................................... 365/148
See application file for complete search history.

(56) References Cited

U.S. PATENT DOCUMENTS

| | | | | |
|---|---|---|---|---|
| 4,933,941 A | * | 6/1990 | Eckard ................ | G06F 11/2736 714/31 |
| 2008/0147970 A1 | * | 6/2008 | Sade .................... | G06F 12/0873 711/113 |
| 2010/0032641 A1 | * | 2/2010 | Mikawa ............. | G11C 13/0007 257/3 |
| 2012/0097915 A1 | * | 4/2012 | Mikawa ................ | H01L 27/101 257/4 |
| 2012/0127779 A1 | * | 5/2012 | Scheuerlein ............. | G11C 5/02 365/148 |
| 2013/0021835 A1 | * | 1/2013 | Hwang ............. | G11C 13/0002 365/148 |

* cited by examiner

*Primary Examiner* — Hoai V Ho
*Assistant Examiner* — Muna A Techane

(57) ABSTRACT

An electronic device includes a semiconductor memory. The semiconductor memory includes a plurality of first lines extending in a first direction, a plurality of second lines extending in a second direction crossing the first direction, a resistance variable layer interposed between the first lines and the second lines, a tunnel barrier layer interposed between the resistance variable layer and the first lines, and an intermediate electrode layer interposed between the resistance variable layer and the tunnel barrier layer. The tunnel barrier layer and the intermediate electrode layer overlap with at least two neighboring intersection regions of the first lines and the second lines.

19 Claims, 12 Drawing Sheets

MEMORY DEVICE HAVING A TUNNEL BARRIER LAYER IN A MEMORY CELL, AND ELECTRONIC DEVICE INCLUDING THE SAME

CROSS-REFERENCE TO RELATED APPLICATIONS

The present application is a continuation-in-part of U.S. patent application Ser. No. 14/167,857, filed Jan. 29, 2014, which claims priority to Korean Patent Application No. 10-2013-0109633, entitled "ELECTRONIC DEVICE" filed on Sep. 12, 2013, which are incorporated herein by reference in their entirety.

TECHNICAL FIELD

Embodiments of the present invention relates to a memory device and an electronic system including the same.

BACKGROUND

Recently, as electronic appliances become smaller, semiconductor devices that have low power consumption, high performance, multi-functionality, and so on, are increasingly in demand. Semiconductor devices are devices that store information and are utilized in various electronic appliances such as computers, portable communication devices, and so on. Such semiconductor devices store data using a characteristic switching between different resistance states according to a voltage or current applied thereto. For example, semiconductor devices include resistive random access memory (RRAM) devices, phase change random access memory (PRAM) devices, ferroelectric random access memory (FRAM) devices, magnetic random access memory (MRAM) devices, E-fuses, etc.

SUMMARY

Embodiments of the present invention relate to a memory device and an electronic system including the same, which improve the reliability of a tunnel barrier layer to be used as a selection element of a memory cell. Thus, it is possible to decrease an operation voltage of a memory cell, simplify fabrication processes, and reduce fabrication costs.

In one aspect, an electronic device may include a plurality of first lines extending in a first direction; a plurality of second lines extending in a second direction crossing the first direction; a resistance variable layer interposed between the first lines and the second lines, and overlapping with at least each of intersection regions of the first lines and the second lines; a tunnel barrier layer interposed between the resistance variable layer and the first lines; and an intermediate electrode layer interposed between the resistance variable layer and the tunnel barrier layer, wherein each of the tunnel barrier layer and the intermediate electrode layer overlaps with each of the first lines, and is divided into two or more portions in the first direction.

Implementations of the above device may include one or more of the following.

A number of the intersection regions overlapping with each of the two or more portions is smaller than a number of the intersection regions overlapping with each of the first lines. A width of each of the two or more portions is smaller than a width of each of the first lines, in the first direction. A width of each of the two or more portions is substantially same as a width of each of the first lines, in the second direction. A planar shape of the tunnel barrier layer is substantially same as a planar shape of the intermediate electrode layer. The resistance variable layer includes a plurality of resistance variable elements each of which has an island configuration and overlaps with a corresponding one of the intersection regions of the first lines and the second lines. The resistance variable layer has a plate shape and overlaps with all of the intersection regions of the first lines and the second lines. The resistance variable layer has a line shape and overlaps with each of the first lines or each of the second lines. The resistance variable layer has a resistance that changes depending on whether or not a current path is created therein. The tunnel barrier layer is formed of a dielectric material which has a larger energy band gap than an energy band gap of the resistance variable layer. A thickness of the tunnel barrier layer is increased as a planar area of each of the tunnel barrier layer and the intermediate electrode layer is increased. Operating voltages applied to the first lines and the second lines are decreased as a planar area of each of the tunnel barrier layer and the intermediate electrode layer increases. The semiconductor memory further comprising: a selection element layer interposed between the resistance variable layer and the first lines. The selection element layer comprises a metal-insulator transition (MIT) element layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages will become apparent in view of the drawings and the description of embodiments provided herein, which are intended to provide further explanation of the invention as claimed.

DETAILED DESCRIPTION

Figure 1A:
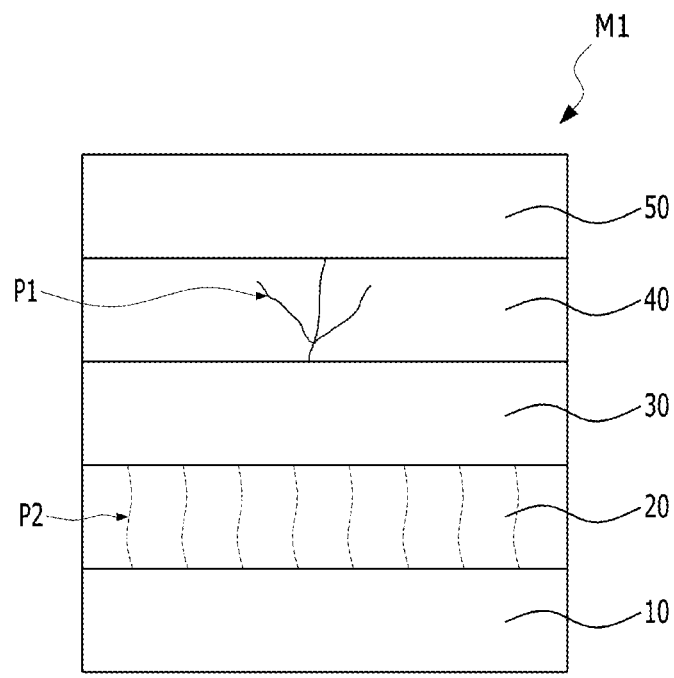
FIG. 1A illustrates a memory cell and a current flowing through the memory cell in accordance with an embodiment of the present disclosure.

Embodiments of the present disclosure will be described with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence of arranging the layers as shown reflects a particular implementation of an embodiment and a different relative positioning relationship or sequence of arranging the layers may be possible. In addition, an embodiment of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Embodiments of the present disclosure relate to a memory device in which a selection element of a memory cell is coupled to one end of a resistance variable element to prevent a leakage current from occurring between memory cells coupled to the same line. The memory device has a cross-point structure where memory cells are disposed in intersection regions of lines that cross each other. The selection element has a non-linear current-voltage characteristic and does not permit a current flow at a voltage equal to or lower than a predetermined threshold voltage. As such a selection element, a transistor, a diode, a tunnel barrier element, a varistor, a metal-insulator transition (MIT) element, or the like may be used.

Hereinafter, FIGS. 1A to 5B will be described, which illustrate embodiments having a tunnel barrier layer that is used as a selection element of a memory cell. FIGS. 6A and 6B illustrate embodiments having a tunnel barrier layer and a selection element, both of which are implemented in a memory cell.

Figure 1B:
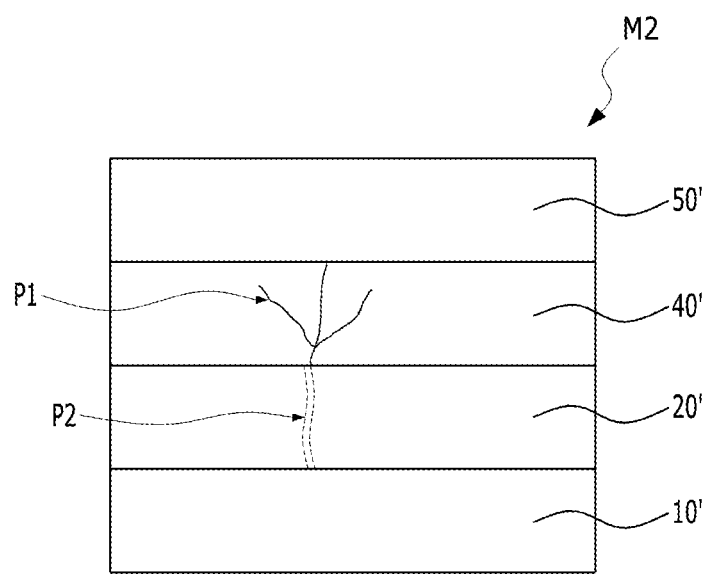
FIG. 1B illustrates another memory cell that is compared to the memory cell of FIG. 1A.
Figure 1C:
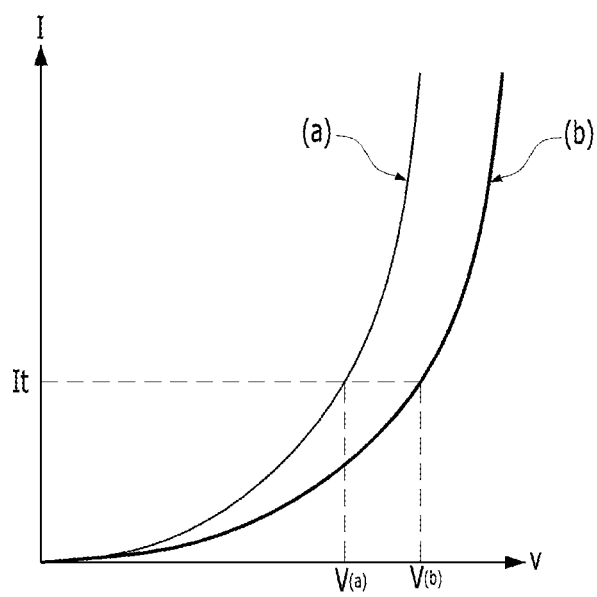
FIG. 1C is a graph showing current-voltage characteristics of tunnel barrier layers of FIGS. 1A and 1B.

FIG. 1A illustrates a memory cell and a current flowing through the memory cell in accordance with an embodiment of the present disclosure. FIG. 1B illustrates another memory cell for comparison with the memory cell of FIG. 1A. FIG. 1C is a graph showing current-voltage characteristics of tunnel barrier layers of the memory cells shown in FIGS. 1A and 1B. For illustrative convenience, the memory cell of FIG. 1A will be referred to as a first memory cell M1, and the memory cell of FIG. 1B will be referred to as a second memory cell M2.

Referring to FIG. 1A, the first memory cell M1 includes a first electrode layer 10, a second electrode layer 50, a resistance variable layer 40 interposed between the first electrode layer 10 and the second electrode layer 50, a tunnel barrier layer 20 interposed between the resistance variable layer 40 and the first electrode layer 10, and an intermediate electrode layer 30 interposed between the tunnel barrier layer 20 and the resistance variable layer 40. In an embodiment, the first electrode layer 10, the tunnel barrier layer 20, the intermediate electrode layer 30, the resistance variable layer 40, and the second electrode layer 50 are sequentially stacked, but embodiments are not limited thereto. In another embodiment, the above layers may be stacked in the reverse order, or one or more other layers may be interposed between the above layers.

The first electrode layer 10 and the second electrode layer 50 supply voltages or a current to both ends of the resistance variable layer 40. Each of the first and second electrode layers 10 and 50 may be a single layer or a multi-layer, which is a layer that includes a plurality of sub-layers, that is formed of at least one conductive material. The conductive material includes metal, such as Pt, Ir, Ru, Al, Cu, W, Ti, Ta, Co, or Ni, metal nitride, such as TiN, TiCN, TiAlN, TiON, TaN, TaCN, TaAlN, TaON, WN, or MoN, or the like. However, embodiments of the present disclosure are not limited thereto.

The resistance variable layer 40 is characterized by switching between different resistance states according to a current or voltage supplied to the first electrode layer 10 and the second electrode layer 50. The resistance variable layer 40 may have a single-layer structure or a multi-layer structure. The resistance variable layer 40 may be formed of at least one of various materials used in an RRAM device, a PRAM device, an FRAM device, an MRAM device, and so forth. Such materials include transition metal oxide, metal oxide such as a perovskite-based material, a phase change material such as a chalcogenide-based material, a ferroelectric material, and a ferromagnetic material.

In an embodiment, the resistance variable layer 40 has a resistance state that changes according to whether or not a filament structure is created as a current path in the resistance variable layer 40. The filament structure may be created by oxygen vacancies or metal ions. The resistance variable layer 40 has a low resistance state when the filament structure is created in the resistance variable layer 40, and has a high resistance state when the filament structure vanishes from or is not formed in the resistance variable layer 40.

In an embodiment, the resistance variable layer 40 includes a double-layered structure of an oxygen-rich metal oxide layer and an oxygen-deficient metal oxide layer. The oxygen-rich metal oxide layer may be formed of $TiO_2$ or $Ta_2O_5$, which satisfies a stoichiometric ratio, and the oxygen-deficient metal oxide layer may be formed of $TiOx$ ($x<2$) or $TaOy$ ($y<2.5$), which is deficient in oxygen. The resistance state of the resistance variable layer 40 may change according to whether or not oxygen vacancies of the oxygen-deficient metal oxide layer are supplied to the oxygen-rich metal oxide layer as a result of the voltage applied to the resistance variable layer 40. Thus, the filament structure is created in the oxygen-rich metal oxide layer by the oxygen vacancies. In an embodiment, the oxygen-rich metal oxide layer is disposed below the oxygen-deficient metal oxide layer. In another embodiment, the oxygen-rich metal oxide layer is disposed over the oxygen-deficient metal oxide layer.

The tunnel barrier layer 20 may be formed of a dielectric material having a larger energy band gap than that of the resistance variable layer 40. The tunnel barrier layer 20 may allow tunneling of electrons according to the voltages applied to the first electrode layer 10 and the second electrode layer 50. The tunnel barrier layer 20 may be formed of silicon nitride, silicon oxide, aluminum oxide, or a combination thereof. However, embodiments are not limited thereto. Since the tunnel barrier layer 20 is formed of a dielectric material, it has a relatively large resistance at a voltage smaller than a voltage that would allow the tunneling of electrons. That is to say, it is possible to substantially prevent a current from flowing through the tunnel barrier layer 20 at a voltage equal to or smaller than a predetermined threshold voltage. The tunnel barrier layer 20 may be coupled in series with the resistance variable layer 40 in the first memory cell M1, and thus may serve as a selection element.

The intermediate electrode layer 30 is interposed between the tunnel barrier layer 20 and the resistance variable layer 40, and separates the tunnel barrier layer 20 from the resistance variable layer 40. The intermediate electrode layer 30 may reduce the density of a current flowing through the tunnel barrier layer 20. This will be described later. The intermediate electrode layer 30 may include a single layer or a multi-layer, which is formed of a conductive material. The conductive material includes metal, such as Pt, Ir, Ru, Al, Cu, W, Ti, Ta, Co, or Ni, metal nitride, such as TiN, TiCN, TiAlN, TiON, TaN, TaCN, TaAlN, TaON, WN, or MoN, or the like. However, embodiments of the present disclosure are not limited thereto.

The current flowing in the first memory cell M1 described above will be compared with a current flowing in the second memory cell M2 of FIG. 1B.

Referring to FIG. 1B, the second memory cell M2 includes a first electrode layer 10', a tunnel barrier layer 20', a resistance variable layer 40', and a second electrode layer 50'. Unlike the first memory cell M1, the second memory cell M2 does not include an intermediate electrode layer that is interposed between the resistance variable layer 40' and the tunnel barrier layer 20'.

In the second memory cell M2, since first filaments P1 are created in the resistance variable layer 40' and second filaments P2 are formed in the tunnel barrier layer 20' due to tunneling of electrons, a current may flow through the memory cell M2.

However, in the second memory cell M2 where the resistance variable layer 40' and the tunnel barrier layer 20' directly contact each other, the second filaments P2 may be formed in the tunnel barrier layer 20' only in a region corresponding to where the first filaments P1 are created in the resistance variable layer 40'. Accordingly, even though an amount of current flowing through the tunnel barrier layer 20' is small, current density in the corresponding region of the resistance variable layer 40' is high because the region where the second filaments P2 are formed is very narrow. As a result, the reliability of the tunnel barrier layer 20' is degraded, and thus characteristics of the second memory cell M2 deteriorate.

In contrast, referring back to FIG. 1A, in the first memory cell MP1, first filaments P1 are created in the resistance variable layer 40 according to the voltages applied to the first electrode layer 10 and the second electrode layer 50, and thus a current flowing through the first filaments P1 may flow throughout the intermediate electrode layer 30. This is because the intermediate electrode layer 30 is formed of a conductive material such as metal. Therefore, tunneling of electrons may occur throughout the tunnel barrier layer 20. In other words, the formation of second filaments P2 is not limited to only the specific regions in the tunnel barrier layer 20 that correspond to where the first filaments P1 are created, but the second filaments are formed throughout the tunnel barrier layer 20. Because the current flows throughout the tunnel barrier layer 20, current density in the tunnel barrier layer 20 may significantly decrease. As a result, the reliability of the tunnel barrier layer 20 may be improved.

Referring to FIG. 1C, the current-voltage characteristic of the tunnel barrier layer 20 is shown by a curve (a), and the current-voltage characteristic of the tunnel barrier layer 20' is shown by a curve (b). As shown in the graph, the curve (a) has a larger slope, that is, a larger increase in the amount of current, than that of the curve (b). Even though the current density of the tunnel barrier layer 20 is lower than that of the tunnel barrier layer 20', since the current flows throughout the entire tunnel barrier layer 20, a larger amount of current flows in the tunnel barrier layer 20 than in the tunnel barrier layer 20' when the same voltage is applied.

For example, it may be assumed that a predetermined current It must flow in the tunnel barrier layers 20 and 20' to operate the first and second memory cells M1 and M2. A voltage V(a) must be applied to the tunnel barrier layer 20 to secure the current It while a voltage V(b), which is greater than the voltage V(a), must be applied to the tunnel barrier layer 20' to secure the current It. That is, an operation voltage of the first memory cell M1 is lower than that of the second memory cell M1.

In addition, since an amount of current flowing through the tunnel barrier layer 20 is larger than that of the tunnel barrier layer 20' at the same voltage, the amount of current may be reduced by increasing the thickness of the tunnel barrier layer 20. By increasing the thickness of the tunnel barrier layer 20, the reliability of the tunnel barrier layer 20 may be further improved.

In semiconductor devices in accordance with the following embodiments, structures capable of increasing planar areas of the intermediate electrode layer 30 and the tunnel barrier layer 20 will be described. Such structures may significantly reduce the current density of the tunnel barrier layer 20, and accordingly improve the reliability of the tunnel barrier layer 20. The reliability of the tunnel barrier layer 20 may be further improved by decreasing a voltage applied to the tunnel barrier layer 20 and increasing the thickness of the tunnel barrier layer 20. The thickness of the tunnel barrier layer 20 can be increased as the planar area of the tunnel barrier layer 20 is increased.

Figure 2A:
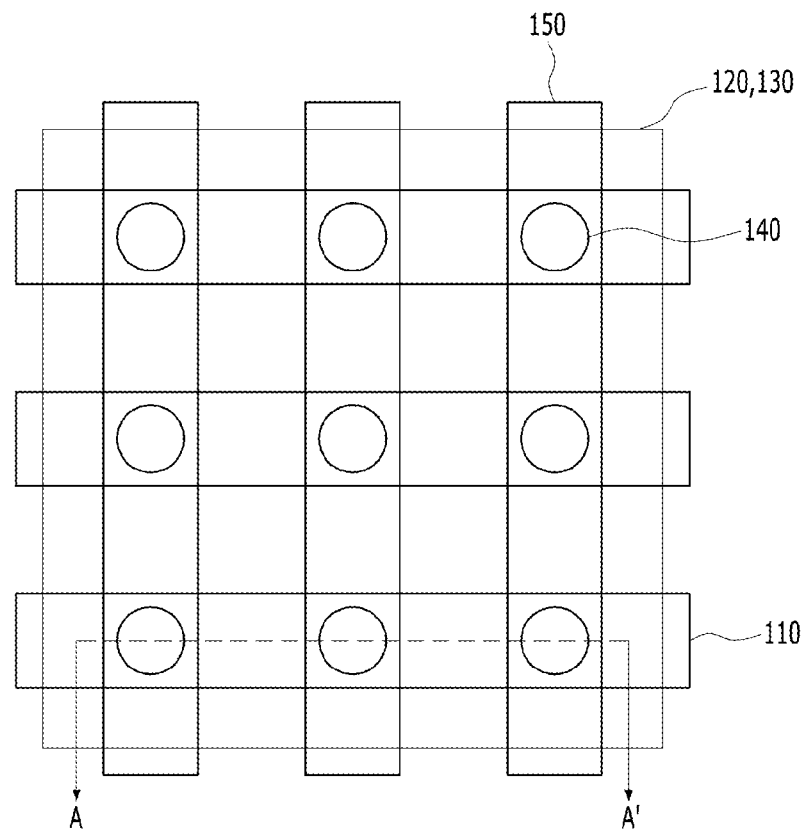
FIG. 2A illustrates a plan view of a semiconductor device in accordance with a first embodiment of the present disclosure.
Figure 2B:
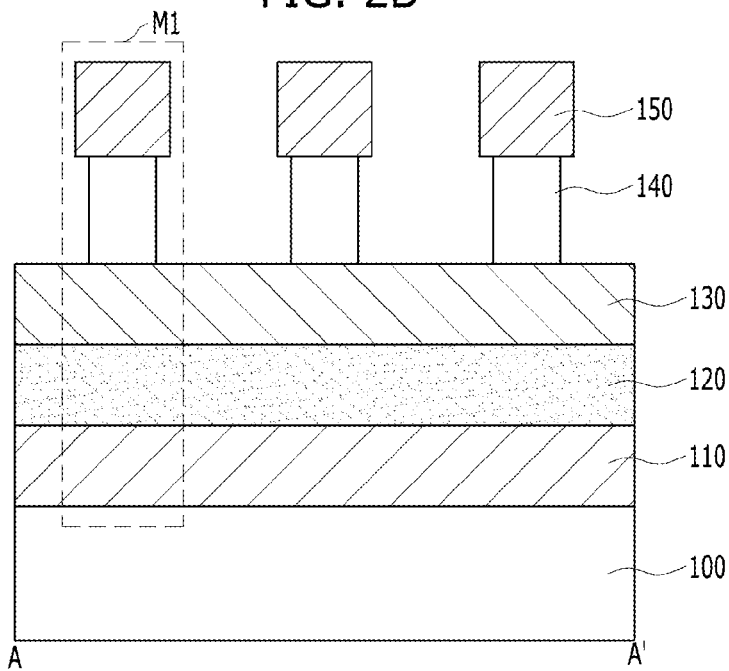
FIG. 2B is a cross-sectional view taken along a line A-A' of FIG. 2A.

FIG. 2A illustrates a plan view of a semiconductor device in accordance with a first embodiment of the present disclosure, and FIG. 2B is a cross-sectional view taken along a line A-A' of FIG. 2A.

Referring to FIGS. 2A and 2B, the semiconductor device includes a plurality of first lines 110, a tunnel barrier layer 120, an intermediate electrode layer 130, a plurality of resistance variable elements 140, and a plurality of second lines 150. The first lines 110 are disposed on a substrate 100 and extend in a first direction parallel to the line A-A'. The tunnel barrier layer 120 and the intermediate electrode layer 130 are sequentially disposed on the first lines 110 and have flat plate shapes. The resistance variable elements 140 are disposed on the intermediate electrode layer 130 and formed to have an island configuration in intersection regions where the first lines 110 and the second lines 150 cross. That is, in an embodiment, each of a plurality of the resistance variable elements 140 is formed as a discrete element in an intersection region of the first lines 110 and the second lines 150. The second lines 150 are disposed on the resistance variable elements 140 and extend in a second direction crossing the first direction.

In an embodiment, the first lines 110, the tunnel barrier layer 120, the intermediate electrode layer 130, the resistance variable elements 140, and the second lines 150 may respectively correspond to the first electrode layer 10, the tunnel barrier layer 20, the intermediate electrode layer 30, the resistance variable layer 40, and the second electrode layer 50 of FIG. 1A, and thus may be formed of the same materials as those of the corresponding layers of FIG. 1A.

The tunnel barrier layer 120 and the intermediate electrode layer 130 may have substantially the same shapes. Since a planar area of each of the tunnel barrier layer 120 and the intermediate electrode layer 130 is large, the current density of the tunnel barrier layer 120 may significantly decrease. As the planar area of the tunnel barrier layer 120 and the intermediate electrode layer 130 increases, operation voltages applied to the first lines 110 and the second lines 150 can be decreased, and the thickness of the tunnel barrier layer 120 can be increased. As a result, the reliability of the tunnel barrier layer 120 can be improved.

Because the tunnel barrier layer 120 and the intermediate electrode layer 130 have the flat, plate shapes, the layers 120 and 130 may be easily patterned. As a result, the difficulty of fabrication processes may be lessened, and thus fabrication costs may be reduced.

Moreover, even though the tunnel barrier layer 120 and the intermediate electrode layer 130 are simultaneously coupled to the plurality of island-type resistance variable elements 140, since the tunnel barrier layer 120 has relatively large resistance in an off state, in which a current does not flow, it is possible to block a leakage current from occurring through unselected memory cells which share the first lines 110 or the second lines 150 with a selected memory cell. Namely, when the tunnel barrier layer 120 is used as a selection element, even though the tunnel barrier layer 120 has the flat, plate shape and is thus shared by a plurality of memory cells, it is possible to block a leakage current occurring through unselected memory cells.

Although in the above-described embodiment, the tunnel barrier layer 120 and the intermediate electrode layer 130 were described as having flat, plate shapes on which the plurality of island-type resistance variable elements 140 is disposed, the shapes of the tunnel barrier layer 120 and the intermediate electrode layer 130 are not limited thereto, and may have different shapes as long as the tunnel barrier layer 120 and the intermediate electrode layer 130 overlap with at least two neighboring island-type resistance variable elements 140. That is, in accordance with an embodiment, the tunnel barrier layer 120 and the intermediate electrode layer 130 overlap with at least two neighboring resistance variable elements among the plurality of resistance variable elements 140, which is formed in the intersection regions of the first lines 110 and the second lines 150. This will be further described later with reference to other embodiments.

Also, although in the above-described embodiments, the tunnel barrier layer 120, the intermediate electrode layer 130, and the resistance variable elements 140 were described as being sequentially stacked, those layers may be stacked in the reverse order. In an embodiment in which the stacking order is changed, the relative shapes and sizes of the respective layers may be substantially the same as those shown and/or described with reference to FIGS. 2A and 2B.

Figure 3A:
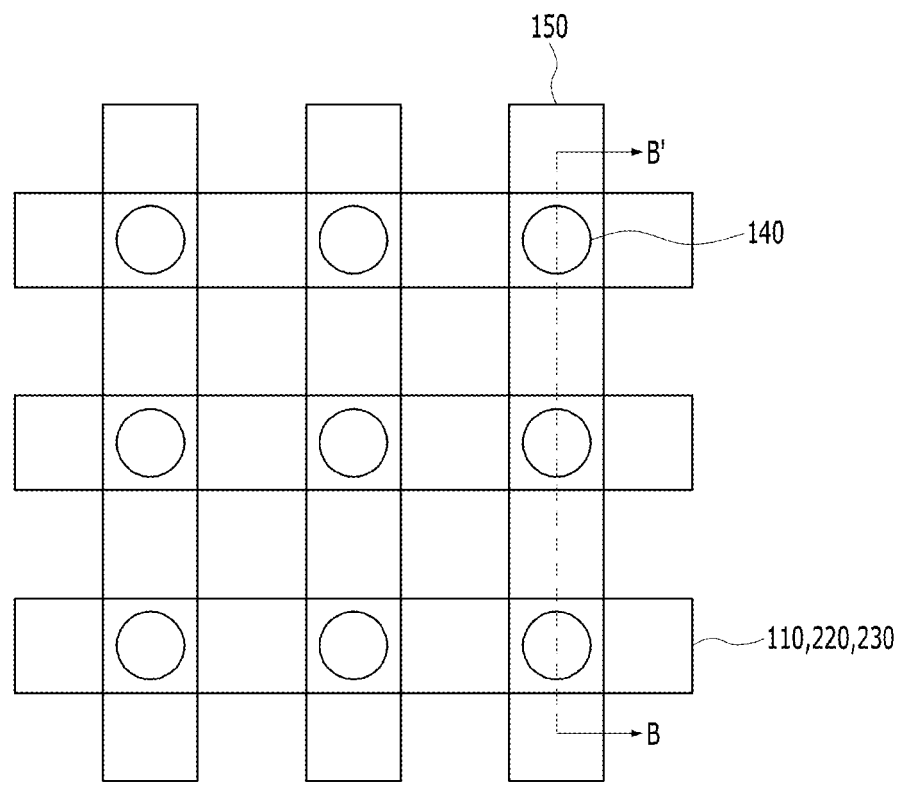
FIG. 3A illustrates a plan view of a semiconductor device in accordance with a second embodiment of the present disclosure.

In addition, although in the above-described embodiments, the resistance variable elements 140 were described as having an island configuration, embodiments of the present disclosure are not limited thereto. FIG. 3A illustrates a plan view of a semiconductor device in accordance with a second embodiment of the present disclosure, and FIG. 3B is a cross-sectional view taken along a line B-B' of FIG. 3A.

Figure 3B:
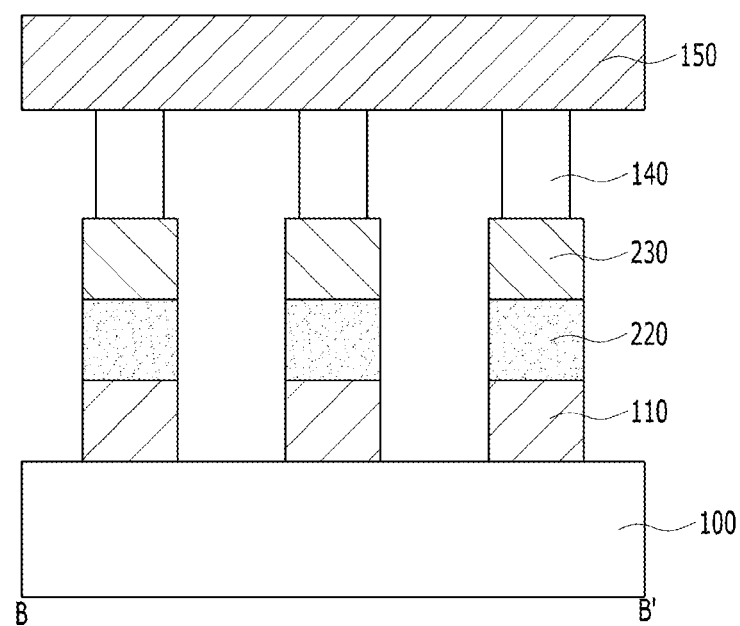
FIG. 3B is a cross-sectional view taken along a line B-B' of FIG. 3A.

Referring to FIGS. 3A and 3B, the semiconductor device includes a plurality of first lines 110, a tunnel barrier layer 220, an intermediate electrode layer 230, a plurality of resistance variable elements 140, and a plurality of second lines 150. The first lines 110 are disposed on a substrate 100 and extend in a first direction. In an embodiment, the first direction is perpendicular to the line B-B'. The tunnel barrier layer 220 and the intermediate electrode layer 230 have substantially the same planar shapes as that of the first lines 110. The resistance variable elements 140 are disposed on the intermediate electrode layer 230 and formed to have an island configuration in intersection regions of the first lines 110 and the second lines 150. The second lines 150 are disposed on the resistance variable elements 140 and extend in a second direction crossing the first direction.

The difference between the embodiment of FIGS. 3A and 3B and the embodiment of FIGS. 2A and 2B resides primarily in that the tunnel barrier layer 220 and the intermediate electrode layer 230 have substantially the same shapes as that of the first lines 110. That is, the layers 220 and 230 have line shapes that extend in the first direction. In this embodiment, while a planar area of each of the tunnel barrier layer 220 and the intermediate electrode layer 230 may be decreased compared to the embodiment of FIGS. 2A and 2B, since the tunnel barrier layer 220 and the intermediate electrode layer 230 can be patterned together with the first lines 110, a fabrication process may be simplified, and thus fabrication costs may be reduced.

Figure 4A:
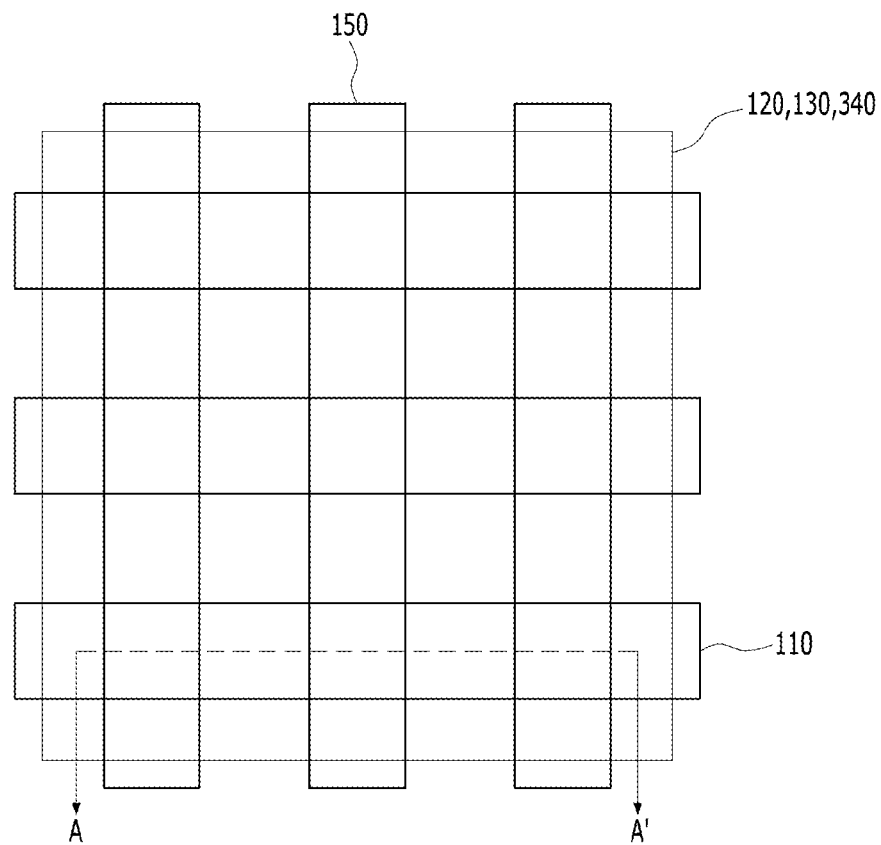
FIG. 4A illustrates a plan view of a semiconductor device in accordance with a third embodiment of the present disclosure.

Although in the above-described embodiment, the tunnel barrier layer 220, the intermediate electrode layer 230, and the resistance variable layer 140 were described as being sequentially stacked, those layers may be stacked in the reverse order. If the stacking order is reversed, the intermediate electrode layer 230 and the tunnel barrier layer 220 may be patterned together with the second lines 150, and accordingly, may have substantially the same planar shapes as that of the second lines 150. FIG. 4A illustrates a plan view of a semiconductor device in accordance with a third embodiment of the present disclosure, and FIG. 4B is a cross-sectional view taken along a line A-A' of FIG. 4A.

Figure 4B:
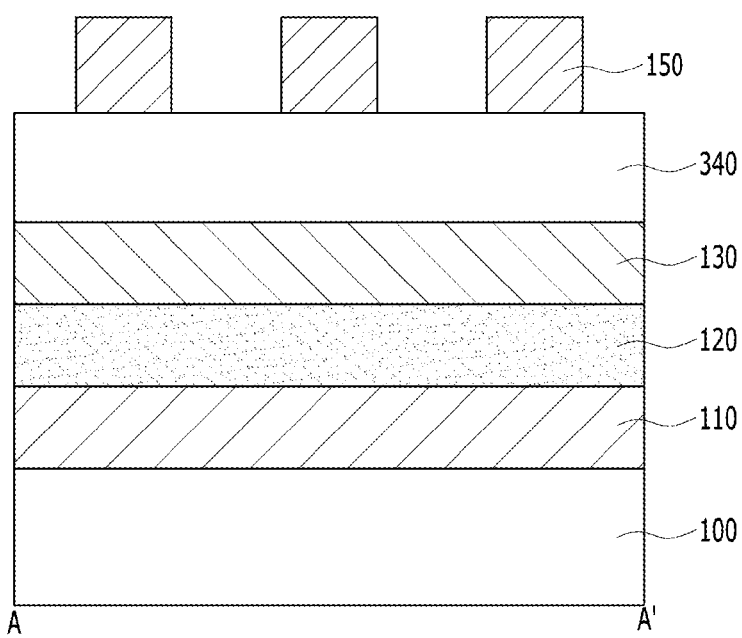
FIG. 4B is a cross-sectional view taken along a line A-A' of FIG. 4A.

Referring to FIGS. 4A and 4B, the semiconductor device includes a plurality of first lines 110, a tunnel barrier layer 120, an intermediate electrode layer 130, a resistance variable layer 340, and a plurality of second lines 150. The first lines 110 are disposed on a substrate 100 and extend in a first direction parallel to the line A-A'. The tunnel barrier layer 120, the intermediate electrode layer 130, and the resistance variable layer 340 are disposed on the first lines 110 and have flat, plate shapes. The second lines 150 are disposed on the resistance variable layer 340 and extend in a second direction crossing the first direction.

The difference between the embodiment of FIGS. 4A and 4B and the embodiment of FIGS. 2A and 2B resides primarily in that the resistance variable layer 340 has a flat, plate shape that is substantially the same as those of the tunnel barrier layer 120 and the intermediate electrode layer 130. In this embodiment, since the resistance variable layer 340, the tunnel barrier layer 120, and the intermediate electrode layer 130 can be patterned together, a fabrication process may be simplified, and thus fabrication costs may be reduced.

The stacking order of the tunnel barrier layer 120, the intermediate electrode layer 130, and the resistance variable layer 340 shown in FIG. 4B may be reversed. Furthermore, in an embodiment, the shapes of the tunnel barrier layer 120 and the intermediate electrode layer 130 may have line shapes substantially the same as that of the first lines 110 or the second lines 150.

Figure 5A:
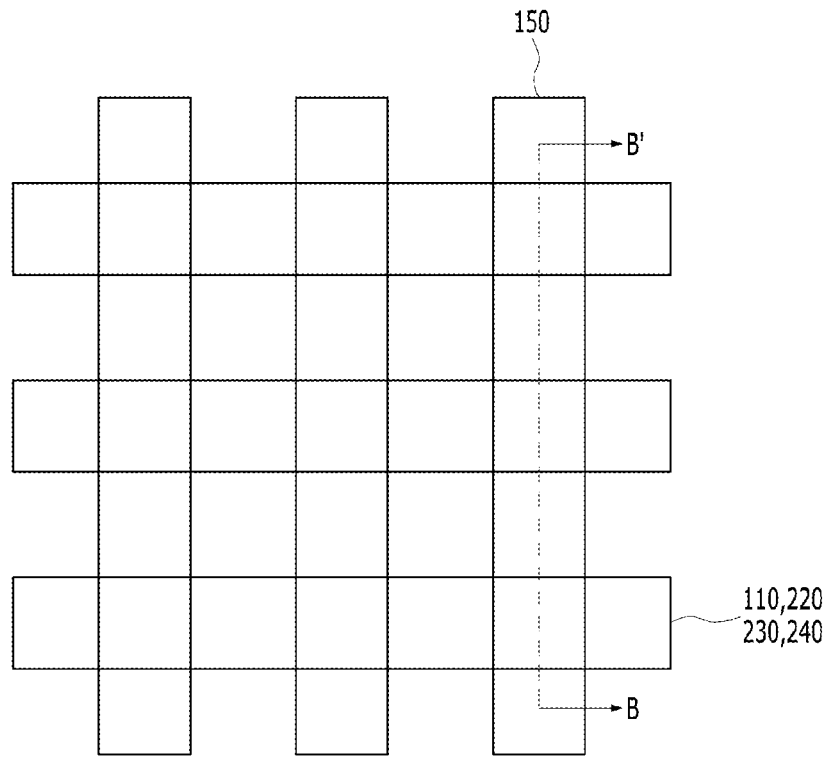
FIG. 5A illustrates a plan view of a semiconductor device in accordance with a fourth embodiment of the present disclosure.
Figure 5B:
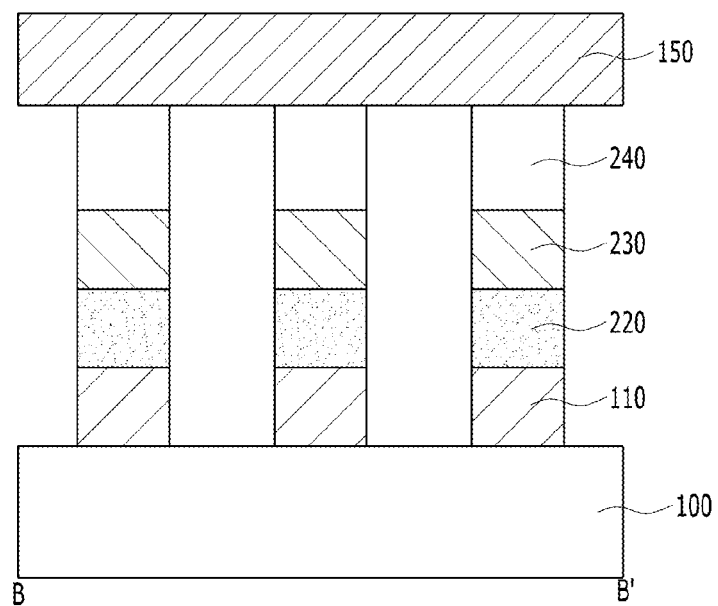
FIG. 5B is a cross-sectional view taken along a line B-B' of FIG. 5A.
Figure 6A:
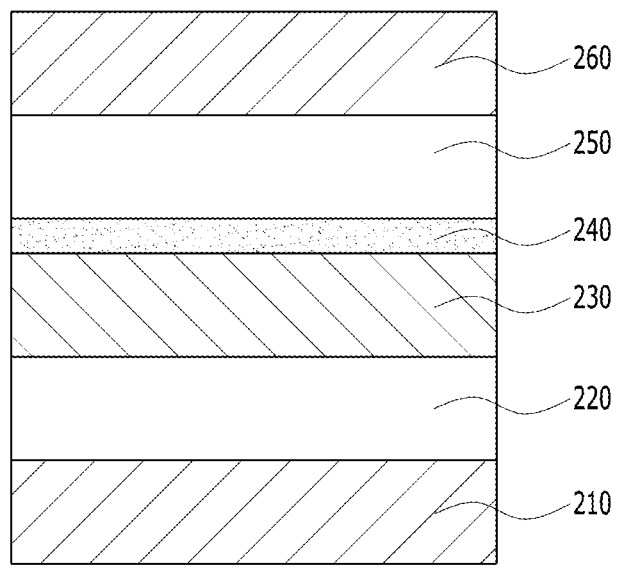
FIGS. 6A and 6B illustrate cross-sectional views of memory cells in accordance with embodiments of the present disclosure.
Figure 6B:
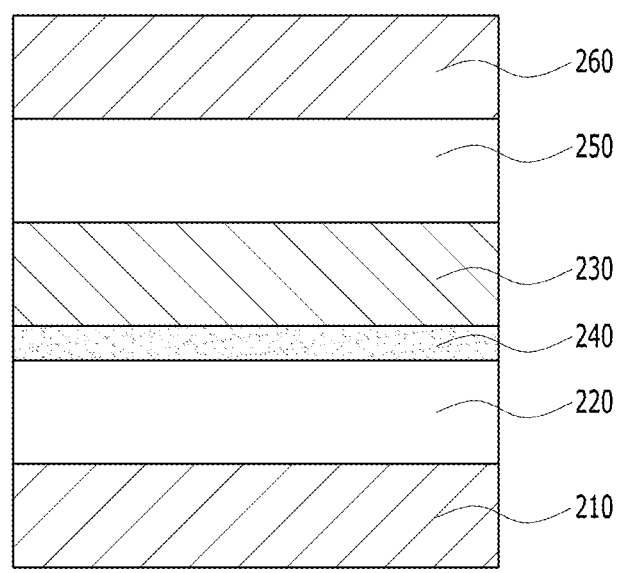

FIG. 5A illustrates a plan view of a semiconductor device in accordance with a fourth embodiment of the present disclosure, and FIG. 5B is a cross-sectional view taken along a line B-B' of FIG. 5A.

Referring to FIGS. 5A and 5B, the semiconductor device includes a plurality of first lines 110, a tunnel barrier layer 220, an intermediate electrode layer 230, a resistance variable layer 240, and a plurality of second lines 150. The first lines 110 are disposed on a substrate 100 and extend in a first direction. In an embodiment, the first direction is substantially perpendicular to the line B-B'. The tunnel barrier layer 220, the intermediate electrode layer 230, and the resistance variable layer 240 are sequentially disposed over the first lines 110 and have substantially the same planar shapes as that of the first lines 110. The second lines 150 are disposed on the resistance variable layer 240 and extend in a second direction that crosses the first direction. In an embodiment, the second direction is parallel to the line B-B'.

The difference between the embodiment of FIGS. 5A and 5B from the embodiment of FIGS. 3A and 3B resides primarily in that the resistance variable layer 240 has substantially the same planar shape as those of the tunnel barrier layer 220 and the intermediate electrode layer 230. In this embodiment, since the resistance variable layer 240, the tunnel barrier layer 220, and the intermediate electrode layer 230 can be patterned together, a fabrication process may be simplified, and thus fabrication costs may be reduced.

The stacking order of the tunnel barrier layer 220, the intermediate electrode layer 230, and the resistance variable layer 240 may be reversed. The tunnel barrier layer 220, the intermediate electrode layer 230, and the resistance variable layer 240 may have line shapes substantially the same as that of the second lines 150.

While a tunnel barrier layer is used as a selection element in the above embodiments, when other elements are used as the selection element, the tunnel barrier layer may be additionally formed together with the selection elements. This will be described below with reference to FIGS. 6A and 6B.

FIGS. 6A and 6B illustrate memory cells in accordance with embodiments of the present disclosure.

Referring to FIG. 6A, a memory cell includes a first electrode layer 610, a second electrode layer 660, a resistance variable layer 650 interposed between the first electrode layer 610 and the second electrode layer 660, a selection element layer 620 interposed between the resistance variable layer 650 and the first electrode layer 610, an intermediate electrode layer 630 interposed between the selection element layer 620 and the resistance variable layer 650, and a tunnel barrier layer 640 interposed between the intermediate electrode layer 630 and the resistance variable layer 650. In this embodiment, the first electrode layer 610, the selection element layer 620, the intermediate electrode layer 630, the tunnel barrier layer 640, the resistance variable layer 650, and the second electrode layer 660 are sequentially stacked, but embodiments are not limited thereto. In another embodiment, the above layers may be stacked in the reverse order. In addition, in an embodiment, one or more other layers may be additionally interposed between the above layers.

The selection element layer 620 may include a non-linear element. In an embodiment, the selection element layer 620 includes a metal-insulator transition (MIT) element layer that is formed of niobium oxide or vanadium oxide. Since symmetrical bidirectional currents may flow through the MIT element layer, the MIT element layer is suitable for being used as a resistance variable element which operates in a bipolar mode. Thus, it is possible to secure an on-off ratio of a memory cell. However, because the MIT element layer has smaller resistance than a tunnel barrier layer, a leakage current may occur to some extent, even in a state in which a current does not flow through the selection element layer 620, that is, even in an off state. Accordingly, in this embodiment, the tunnel barrier layer 640 is used together with the selection element layer 620, and thus a leakage current in an off state may be substantially prevented.

Referring to FIG. 6B, positions of the intermediate layer 630 and the tunnel barrier layer 640 are exchanged when compared to the embodiment shown in FIG. 6A. That is, while the tunnel barrier layer 640 is disposed over the intermediate layer 630 in FIG. 6A, the tunnel barrier layer 640 is disposed below the intermediate layer 630 in FIG. 6B.

The memory cell of FIG. 6A or 6B may be realized in a semiconductor device having a cross-point structure.

Meanwhile, in the above embodiments, since a tunnel barrier layer includes an insulating material, it is advantageous to block a leakage current. However, when a size of a cell array increases, the leakage current may be increased. A structure to reduce the leakage current will be exemplarily described with reference to FIGS. 7A and 7B.

Figure 7A:
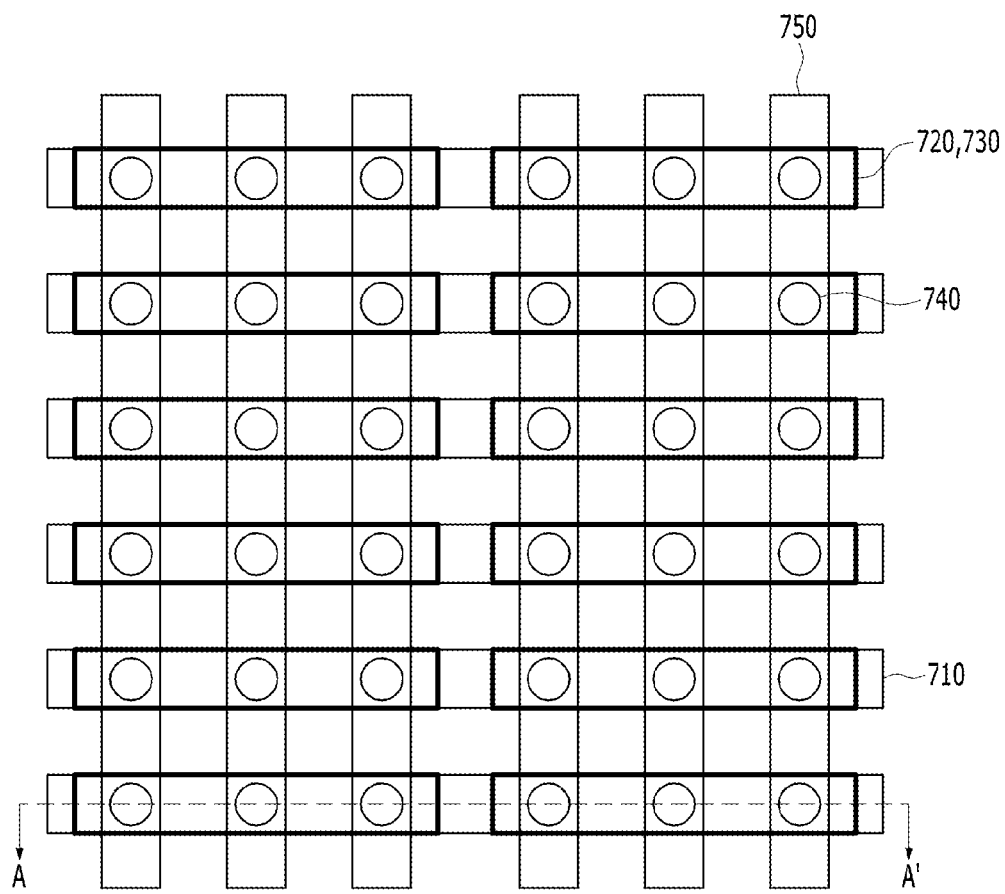
FIG. 7A illustrates a plan view of a semiconductor device in accordance with another embodiment of the present disclosure.
Figure 7B:
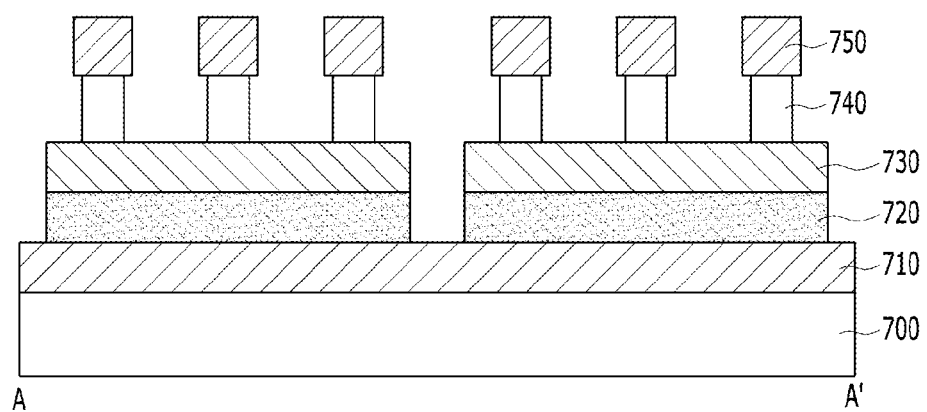
FIG. 7B is a cross-sectional view taken along a line A-A' of FIG. 7A.

FIG. 7A illustrates a plan view of a semiconductor device in accordance with another embodiment of the present disclosure, and FIG. 7B is a cross-sectional view taken along a line A-A' of FIG. 7A. For elements substantially same as the above embodiments, detailed descriptions may be skipped.

Referring to FIGS. 7A and 7B, the semiconductor device of this embodiment may include a substrate 700, a plurality of first lines 710, a tunnel barrier layer 720, an intermediate electrode layer 730, a plurality of resistance variable elements 740, and a plurality of second lines 750. The first lines 710 may be disposed over the substrate 700 and extend in a first direction parallel to the line A-A'. A stack structure of the tunnel barrier layer 720 and the intermediate electrode layer 730 may be disposed over the first lines 710 and overlap with each of the first lines 710. The resistance variable elements 740 may be disposed over the intermediate electrode layer 730 and formed to have an island configuration in intersection regions of the first lines 710 and the second lines 750. The second lines 750 may be disposed over the resistance variable elements 740 and extend in a second direction crossing the first direction.

Here, the stack structure of the tunnel barrier layer 720 and the intermediate electrode layer 730 may be divided into two or more portions in the first direction while overlapping with each of the first lines 710. Therefore, a number of the resistance variable elements 740 overlapping with each portion of the stack structure of the tunnel barrier layer 720 and the intermediate electrode layer 730 is smaller than a number of the resistance variable elements 740 overlapping with each of the first lines 710. For example, as shown in this figure, the stack structure of the tunnel barrier layer 720 and the intermediate electrode layer 730 may be divided into two portions in the first direction so that each of the two portions overlaps with three resistance variable elements 740 while each of the first lines 710 overlaps with six resistance variable elements 740. Here, in order to secure a planar area of the tunnel barrier layer 720 and the intermediate electrode layer 730, the number of the resistance variable elements 740 overlapping with each portion of the stack structure of the tunnel barrier layer 720 and the intermediate electrode layer 730 may be two or more. A width of each portion of the stack structure of the tunnel barrier layer 720 and the intermediate electrode layer 730 is substantially same as a width of each of the first lines 710 in the second direction, while a width of each portion of the stack structure of the tunnel barrier layer 720 and the intermediate electrode layer 730 is smaller than a width of each of the first lines 710 in the first direction.

By this embodiment, it is possible to secure a planar area of the tunnel barrier layer 720 and the intermediate electrode layer 730 to a certain degree. Furthermore, a leakage current flow may be blocked by dividing the tunnel barrier layer 720 and the intermediate electrode layer 730 into two or more portions in the first direction.

As is apparent from the above descriptions, in accordance with embodiments of the present disclosure, it is possible to decrease an operating voltage of a memory cell, simplify a fabrication process, and reduce fabrication costs.

Memory devices or semiconductor devices in accordance with an embodiment can be employed in electronic devices or systems. FIGS. 8 to 12 illustrate devices or systems that include a memory device or semiconductor device in accordance with an embodiment of the present disclosure.

Figure 8:
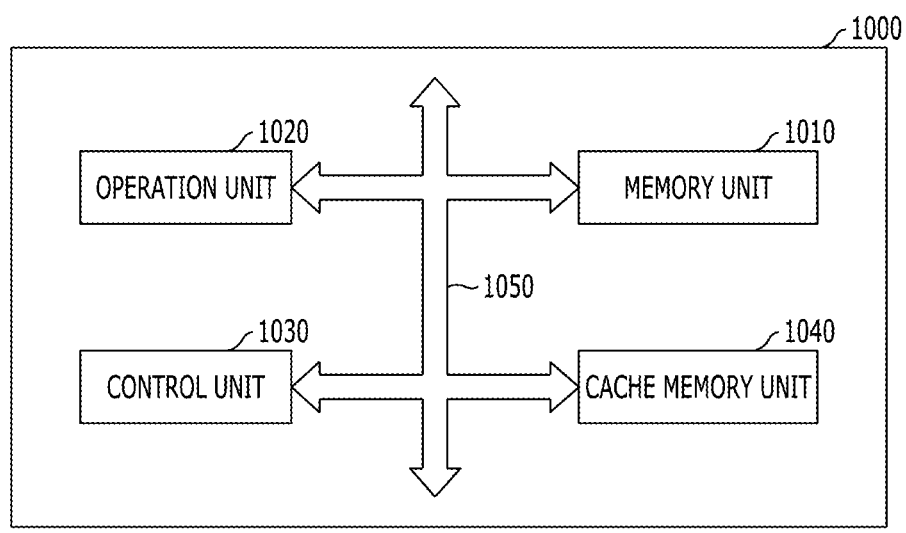
FIG. 8 illustrates a microprocessor in accordance with an embodiment of the present disclosure.

FIG. 8 illustrates a microprocessor 1000 in accordance with an embodiment of the present disclosure.

Referring to FIG. 8, the microprocessor 1000 may perform tasks for controlling and tuning a series of processes related to receiving data from various external devices, processing the data, and outputting processing results to external devices. The microprocessor 1000 includes a memory unit 1010, an operation unit 1020, a control unit 1030, and so on. The microprocessor 1000 may be any of data processing units such as a central processing unit (CPU), a graphic processing unit (GPU), a digital signal processor (DSP), and an application processor (AP).

The memory unit 1010 stores data in the microprocessor 1000, as a processor register, a register, or the like. The memory unit 1010 may include a data register, an address register, a floating point register, and so on. The memory unit 1010 may include various registers. The memory unit 1010 may temporarily store data for operations to be performed by the operation unit 1020, data resulting from the operations, and addresses where data for performing the operations is stored.

The memory unit 1010 may include one or more semiconductor devices in accordance with embodiments of the present disclosure. For example, the memory unit 1010 may include a plurality of first lines extending in a first direction; a plurality of second lines extending in a second direction crossing the first direction; a resistance variable layer interposed between the first lines and the second lines, and overlapping with at least each of intersection regions of the first lines and the second lines; a tunnel barrier layer interposed between the resistance variable layer and the first lines; and an intermediate electrode layer interposed between the resistance variable layer and the tunnel barrier layer, wherein each of the tunnel barrier layer and the intermediate electrode layer overlaps with each of the first lines, and is divided into two or more portions in the first direction. As a result, data storage characteristics of the memory unit 1010 may be improved, fabrication may be simplified, and fabrication costs of the memory unit 1010 may be reduced. In addition, operating characteristics of the microprocessor 1000 may be improved.

The operation unit 1020 may perform arithmetic operations or logical operations based on results from the control unit 1030 as it decodes commands. The operation unit 1020 may include at least one arithmetic logic unit (ALU).

The control unit 1030 may receive signals from the memory unit 1010, the operation unit 1020, and a device external to the microprocessor 1000, extract and decode of commands, control input and output of signals of the microprocessor 1000, and execute processing represented by programs.

The microprocessor 1000 also includes a cache memory unit 1040 which can temporarily store data inputted from an external device or data to be outputted to an external device. In this case, the cache memory unit 1040 may exchange data with the memory unit 1010, the operation unit 1020, and the control unit 1030 through a bus interface 1050.

Figure 9:
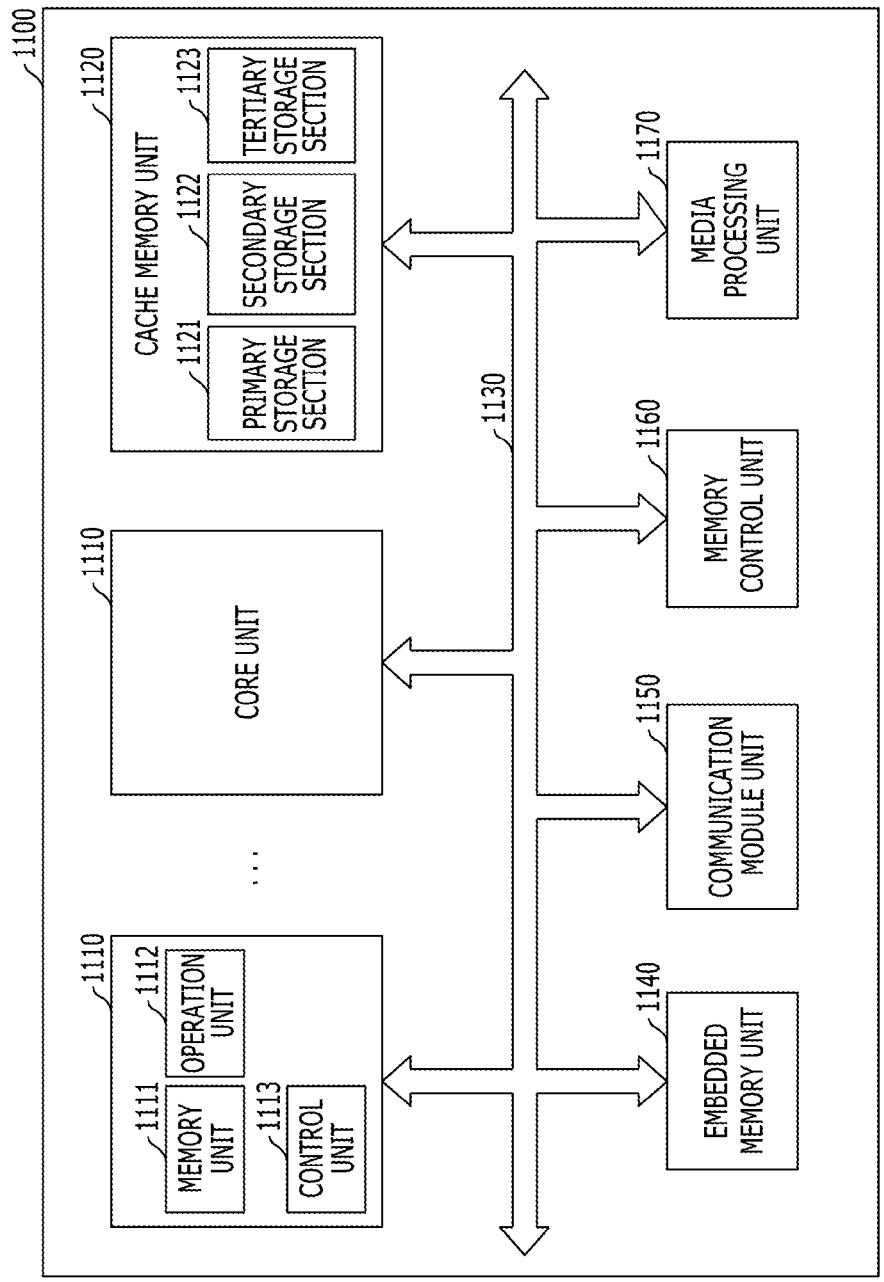
FIG. 9 illustrates a processor in accordance with an embodiment of the present disclosure.

FIG. 9 illustrates a processor 1100 in accordance with an embodiment of the present disclosure.

Referring to FIG. 9, the processor 1100 may improve performance and realize multi-functionality by including various functions other than those of a microprocessor, which performs tasks for controlling and tuning a series of processes related to receiving data from various external devices, processing the data, and outputting results to external devices. The processor 1100 includes a core unit 1110 which serves as a microprocessor, a cache memory unit 1120 which serves to temporarily store data, and a bus interface 1130 for transferring data between internal and external devices. The processor 1100 may be any of various system-on-chips (SoCs) such as a multi-core processor, a graphic processing unit (GPU), and an application processor (AP).

The core unit 1110 may perform arithmetic logic operations for data inputted from an external device, and includes a memory unit 1111, an operation unit 1112, and a control unit 1113.

The memory unit 1111 stores data in the processor 1100, as a processor register, a register, or the like. The memory unit 1111 may include a data register, an address register, a floating point register, and so on. The memory unit 1111 may include a plurality of registers. The memory unit 1111 may temporarily store data for operations to be performed by the operation unit 1112, data resulting from the operations, and addresses where data for performing of the operations are stored. The operation unit 1112 performs operations in the processor 1100. The operation unit 1112 may perform arithmetic operations, logical operations based on commands decoded by the control unit 1113, or the like. The operation unit 1112 may include at least one arithmetic logic unit (ALU). The control unit 1113 may receive signals from the memory unit 1111, the operation unit 1112, and a device external to the processor 1100, perform extraction and decoding of commands, control input and output of signals of processor 1100, and execute processing represented by programs.

The cache memory unit 1120 may temporarily store data to compensate for a difference in data processing speed between the core unit 1110, which operates at a high speed, and an external device, which may operate at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 when high storage capacity is required. As the occasion demands, the cache memory unit 1120 may include an increased number of storage sections. That is to say, the number of storage sections which are included in the cache memory unit 1120 may be changed according to the design of the processor 1100. The primary, secondary, and tertiary storage sections 1121, 1122, and 1123 may have the same processing speed or different processing speeds. If the speeds of the storage sections 1121, 1122, and 1123 are different, the speed of the primary storage section 1121 may be highest.

At least one storage section of the primary storage section 1121, the secondary storage section 1122, and the tertiary storage section 1123 of the cache memory unit 1120 may include one or more semiconductor devices in accordance with embodiments of the present disclosure. For example, the cache memory unit 1120 may include a plurality of first lines extending in a first direction; a plurality of second lines extending in a second direction crossing the first direction; a resistance variable layer interposed between the first lines and the second lines, and overlapping with at least each of intersection regions of the first lines and the second lines; a tunnel barrier layer interposed between the resistance variable layer and the first lines; and an intermediate electrode layer interposed between the resistance variable layer and the tunnel barrier layer, wherein each of the tunnel barrier layer and the intermediate electrode layer overlaps with each of the first lines, and is divided into two or more portions in the first direction. As a result, data storage characteristics of the cache memory unit 1120 may be improved, fabrication processes may be simplified, and fabrication costs of the cache memory unit 1120 may be reduced. In addition, operating characteristics of the processor 1100 may be improved.

Although FIG. 9 illustrates that all the primary, secondary, and tertiary storage sections 1121, 1122, and 1123 are disposed inside the cache memory unit 1120, other configurations are possible. The primary, secondary, and tertiary storage sections 1121, 1122, and 1123 of the cache memory unit 1120 may be disposed inside the core unit 1110, and may compensate for the difference in data processing speed between the core unit 1110 and an external device. In another embodiment, the primary storage section 1121 of the cache memory unit 1120 may be disposed inside the core unit 1110, and the secondary storage section 1122 and the tertiary storage section 1123 may be disposed outside the core unit 1110 to better compensate for a difference in data processing speeds. In yet another embodiment, the primary and secondary storage sections 1121 and 1122 may be disposed inside the core unit 1110, and the tertiary storage section 1123 may be disposed outside the core unit 1110.

The bus interface 1130 connects the core unit 1110, the cache memory unit 1120, and external devices, and allows data to be efficiently transmitted.

The processor 1100 may include a plurality of core units 1110, and the plurality of core units 1110 may share the cache memory unit 1120. The plurality of core units 1110 and the cache memory unit 1120 may be directly connected or may be connected through the bus interface 1130. If the processor 1100 includes a plurality of core units 1110, the primary storage section 1121 may be disposed in each core unit 1110, and the secondary storage section 1122 and the tertiary storage section 1123 may be disposed outside the plurality of core units 1110 to be shared by the plurality of core units 1110 through the bus interface 1130. The processing speed of the primary storage section 1121 may be higher than the processing speeds of the secondary and tertiary storage section 1122 and 1123. In another embodiment, the primary storage section 1121 and the secondary storage section 1122 may be disposed in each core unit 1110, and the tertiary storage section 1123 may be disposed outside the plurality of core units 1110 to be shared by the plurality of core units 1110 through the bus interface 1130.

The processor 1100 may further include an embedded memory unit 1140 which stores data, a communication module unit 1150 which can transmit and receive data to and from an external device in a wired or wireless manner, a memory control unit 1160 which drives an external memory device, and a media processing unit 1170 which processes data processed in the processor 1100 or data inputted from an external input device and outputs the processed data to an external interface device. The processor 1100 may include a plurality of modules or devices. In an embodiment, the plurality of modules may exchange data with the core units 1110 and the cache memory unit 1120, and with one another, through the bus interface 1130.

The embedded memory unit 1140 may include not only a volatile memory, but also a nonvolatile memory. The volatile memory may include a DRAM (dynamic random access memory), a mobile DRAM, an SRAM (static random access memory), or a memory with a similar function to that of any of the above mentioned memories. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), or the like.

The communication module unit 1150 may include a module capable of being connected with a wired network, a module capable of being connected with a wireless network, or both. The wired network module may be implemented with a local area network (LAN), a universal serial bus (USB), an Ethernet, power line communication (PLC) (e.g., various devices that send and receive data through transmission lines), or the like. The wireless network module may be implemented with Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) (e.g., various devices that send and receive data without transmission lines), or the like.

The memory control unit 1160 administrates and processes data transmitted between the processor 1100 and an external storage device operating according to a different communication standard from the processor 1100. The memory control unit 1160 may include any of various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process data processed in the processor 1100 or image data, voice data, and other data from the external input device, and output the processed data to the external interface device. The media processing unit 1170 may include a graphic processing unit (GPU), a digital signal processor (DSP), a high definition audio device (HD audio), a high definition multimedia interface (HDMI) controller, and so on.

Figure 10:
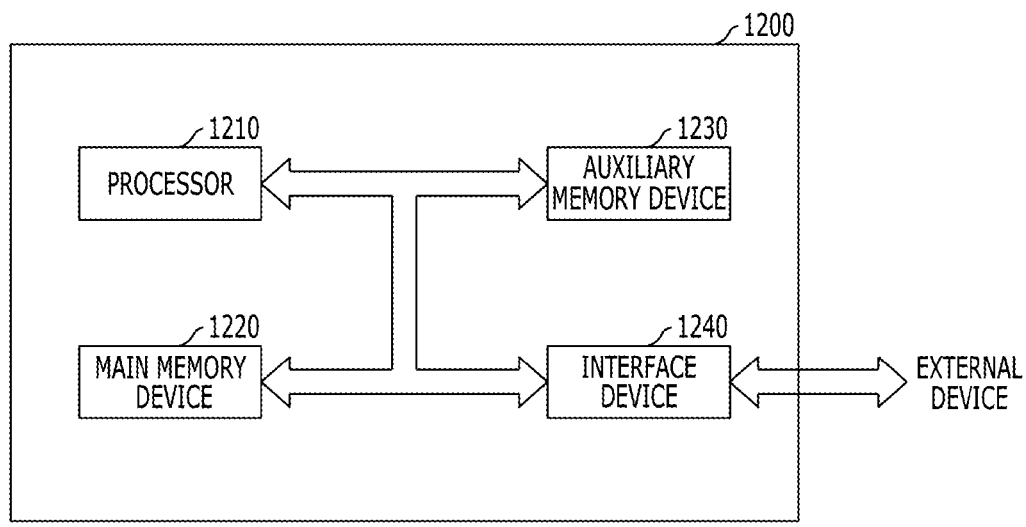
FIG. 10 illustrates a system in accordance with an embodiment of the present disclosure.

FIG. 10 illustrates a system 1200 including memory circuitry in accordance with an embodiment of the present disclosure.

Referring to FIG. 10, the system 1200, as an apparatus for processing data, may perform input, processing, output, communication, storage, etc. to conduct a series of manipulations of data. The system 1200 includes a processor 1210, a main memory device 1220, an auxiliary memory device 1230, and an interface device 1240. The system 1200 may be any of various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands, process operations for data stored in the system 1200, and control execution of these operations. The processor 1210 may include a microprocessor unit (MPU), a central processing unit (CPU), a single/multi-core processor, a graphic processing unit (GPU), an application processor (AP), a digital signal processor (DSP), or the like.

The main memory device 1220 is a storage which can temporarily store, call, and execute program codes or data from the auxiliary memory device 1230 when programs are executed and can conserve stored contents even without power. The main memory device 1220 may include one or more semiconductor devices in accordance with embodiments of the present disclosure. For example, the main memory device 1220 may include a plurality of first lines extending in a first direction; a plurality of second lines extending in a second direction crossing the first direction; a resistance variable layer interposed between the first lines and the second lines, and overlapping with at least each of intersection regions of the first lines and the second lines; a tunnel barrier layer interposed between the resistance variable layer and the first lines; and an intermediate electrode layer interposed between the resistance variable layer and the tunnel barrier layer, wherein each of the tunnel barrier layer and the intermediate electrode layer overlaps with each of the first lines, and is divided into two or more portions in the first direction. As a result, data storage characteristics of the main memory device 1220 may be improved, fabrication may be simplified, and fabrication costs in fabricating the main memory device 1220 may be reduced. In addition, operating characteristics of the system 1200 may be improved.

The main memory device 1220 may further include a volatile memory such as a static random access memory (SRAM), a dynamic random access memory (DRAM), or the like. In another embodiment, the main memory device 1220 may not include a semiconductor device according to an embodiment of the present disclosure, but include a volatile memory such as a static random access memory (SRAM), a dynamic random access memory (DRAM), or the like while another memory of the system 1200 may implement a semiconductor device in accordance with an embodiment.

The auxiliary memory device 1230 is a memory device for storing program codes or data. While the processing speed of the auxiliary memory device 1230 is lower than that of the main memory device 1220, the auxiliary memory device 1230 can store a larger amount of data than the main memory device 1220. The auxiliary memory device 1230 may include one or more semiconductor devices in accordance with embodiments of the present disclosure. For example, the auxiliary memory device 1230 may include a plurality of first lines extending in a first direction; a plurality of second lines extending in a second direction crossing the first direction; a resistance variable layer interposed between the first lines and the second lines, and overlapping with at least each of intersection regions of the first lines and the second lines; a tunnel barrier layer interposed between the resistance variable layer and the first lines; and an intermediate electrode layer interposed between the resistance variable layer and the tunnel barrier layer, wherein each of the tunnel barrier layer and the intermediate electrode layer overlaps with each of the first lines, and is divided into two or more portions in the first direction. As a result, data storage characteristics of the auxiliary memory device 1230 may be improved, fabrication may be simplified, and fabrication costs of the auxiliary memory device 1230 may be reduced. In addition, operating characteristics of the system 1200 may be improved.

The auxiliary memory device 1230 may further include a data storage system (see reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

In another embodiment, the auxiliary memory device 1230 may not include a semiconductor device according to an embodiment of the present disclosure, but includes any of the data storage systems mentioned above. In such an embodiment, another memory included in the system 1200 may implement a semiconductor device in accordance with an embodiment, while the auxiliary memory device 1230 uses a data storage system such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

The interface device 1240 may perform exchange of commands and data between the system 1200 and an external device. The interface device 1240 may include one or more of a keypad, a keyboard, a mouse, a speaker, a microphone, a display, various human interface devices (HIDs), a communication device, and so on. The communication device may include a module capable of being connected with a wired network, a module capable of being connected with a wireless network, or both. The wired network module may be implemented with a local area network (LAN), a universal serial bus (USB), an Ethernet, power line communication (PLC) (e.g., various devices which send and receive data through transmission lines), and so on. The wireless network module be implemented with one or more of Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) (e.g., various devices which send and receive data without transmission lines), and so on.

Figure 11:
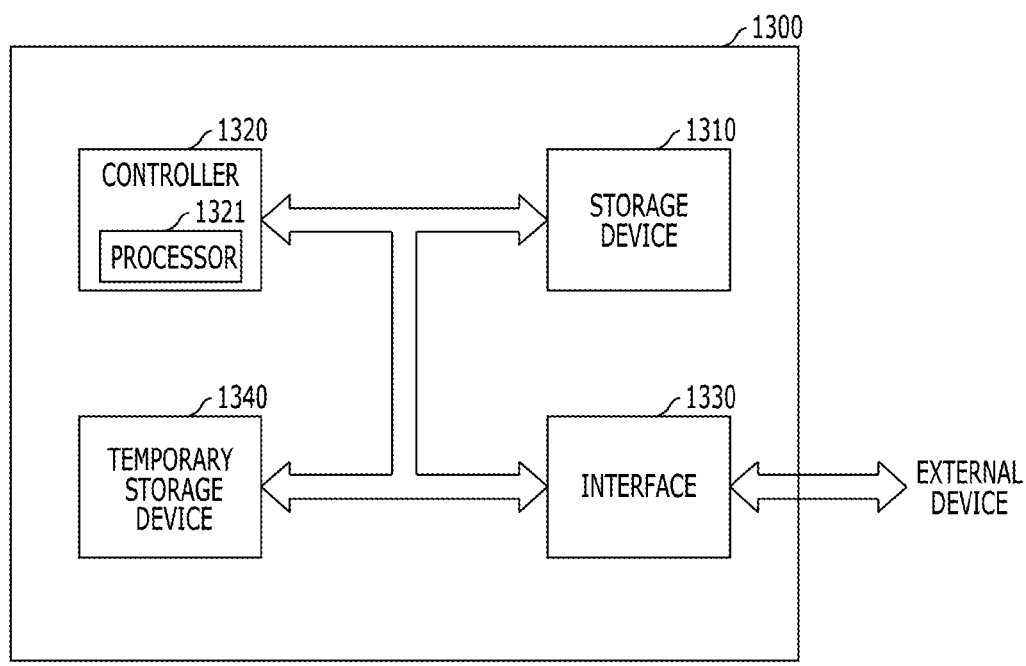
FIG. 11 illustrates a data storage system in accordance with an embodiment of the present disclosure.

FIG. 11 illustrates a data storage system 1300 including memory circuitry in accordance with an embodiment of the present disclosure.

Referring to FIG. 11, the data storage system 1300 includes a storage device 1310, which has nonvolatile characteristics, as a component for storing data, a controller 1320, which controls the storage device 1310, an interface 1330 for connection with an external device, and a temporary storage device 1340 for storing data temporarily.

The data storage system 1300 may be a disk type device or a card type device. The disk type device may include any of a hard disk drive (HDD), a compact disc read only memory (CDROM), a digital versatile disc (DVD), a solid state disk (SSD), and so on, and the card type device may include any of a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory such as a ROM (read only memory), a NOR flash memory, a NAND flash memory, a phase change random access memory (PRAM), a resistive random access memory (RRAM), a magnetic random access memory (MRAM), or the like.

The controller 1320 may control exchange of data between the storage device 1310 and the interface 1330. The controller 1320 includes a processor 1321 for performing an operation and processing commands inputted through the interface 1330 from outside the data storage system 1300.

The interface 1330 performs exchange of commands and data between the data storage system 1300 and the external device. If the data storage system 1300 is a card type device, the interface 1330 may be compatible with interfaces used in devices such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. If the data storage system 1300 is a disk type device, the interface 1330 may be compatible with interfaces such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on. The interface 1330 may be compatible with one or more different types of interfaces.

The temporary storage device 1340 can store data temporarily to efficiently transfer data between the interface 1330 and the storage device 1310 according to the diversification and high performance of an interface with an external device, a controller, and a system. The temporary storage device 1340 may include one or more semiconductor devices in accordance with embodiments of the present disclosure. The temporary storage device 1340 may include a plurality of first lines extending in a first direction; a plurality of second lines extending in a second direction crossing the first direction; a resistance variable layer interposed between the first lines and the second lines, and overlapping with at least each of intersection regions of the first lines and the second lines; a tunnel barrier layer interposed between the resistance variable layer and the first lines; and an intermediate electrode layer interposed between the resistance variable layer and the tunnel barrier layer, wherein each of the tunnel barrier layer and the intermediate electrode layer overlaps with each of the first lines, and is divided into two or more portions in the first direction. As a result, data storage characteristics of the temporary storage device 1340 may be improved, fabrication may be simplified, and fabrication costs of the temporary storage device 1340 may be reduced. In addition, operating characteristics of the data storage system 1300 may be improved.

Figure 12:
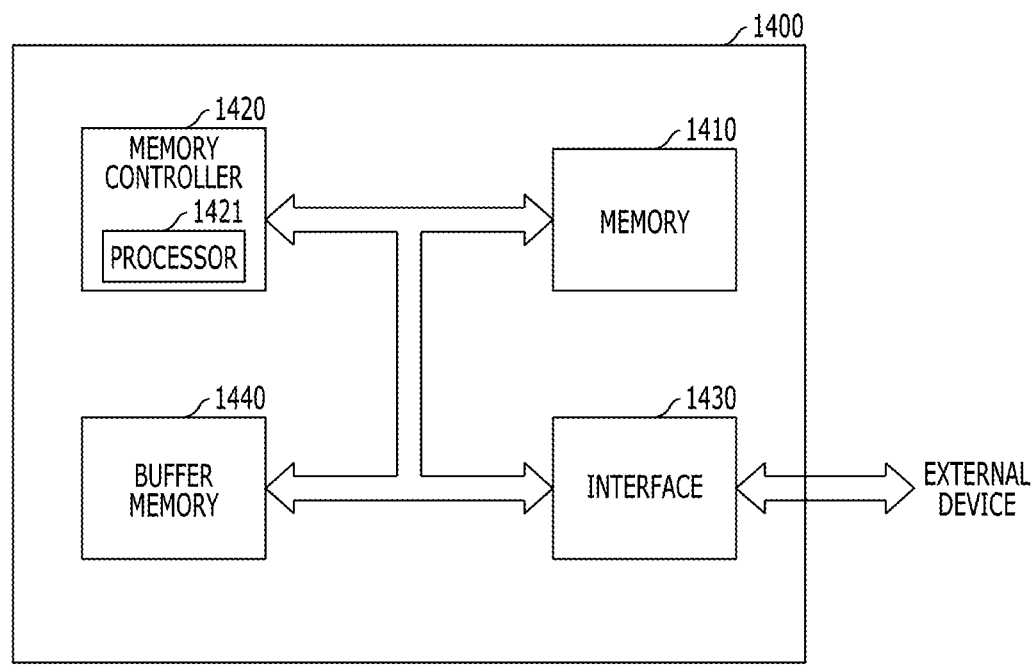
FIG. 12 illustrates a memory system in accordance with an embodiment of the present disclosure.

FIG. 12 illustrates a memory system 1400 including memory circuitry in accordance with an embodiment of the present disclosure.

Referring to FIG. 12, the memory system 1400 includes a memory 1410, which has nonvolatile characteristics, as a component for storing data, a memory controller 1420, which controls the memory 1410, and an interface 1430 for connection with an external device. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

The memory 1410 may include one or more semiconductor devices in accordance with embodiments of the present disclosure. For example, the memory 1410 may include a plurality of first lines extending in a first direction; a plurality of second lines extending in a second direction crossing the first direction; a resistance variable layer interposed between the first lines and the second lines, and overlapping with at least each of intersection regions of the first lines and the second lines; a tunnel barrier layer interposed between the resistance variable layer and the first lines; and an intermediate electrode layer interposed between the resistance variable layer and the tunnel barrier layer, wherein each of the tunnel barrier layer and the intermediate electrode layer overlaps with each of the first lines, and is divided into two or more portions in the first direction. As a result, data storage characteristics of the memory 1410 may be improved, fabrication may be simplified, and fabrication costs of the memory 1410 may be reduced. In addition, operating characteristics of the memory system 1400 may be improved.

The memory 1410 may further include any of a ROM (read only memory), a NOR flash memory, a NAND flash memory, a phase change random access memory (PRAM), a resistive random access memory (RRAM), a magnetic random access memory (MRAM), and so on, which have nonvolatile characteristics.

The memory controller 1420 may control the exchange of data between the memory 1410 and the interface 1430. The memory controller 1420 may include a processor 1421 for performing an operation and processing commands inputted through the interface 1430 from outside of the memory system 1400.

The interface 1430 performs exchange of commands and data between the memory system 1400 and the external device. The interface 1430 may be compatible with other interfaces used in devices such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. The interface 1430 may be compatible with one or more different types of interfaces.

The memory system 1400 further includes a buffer memory 1440 for efficiently transferring data between the interface 1430 and the memory 1410 according to the diversification and high performance of an interface with an external device, a memory controller, and a memory system. For example, the buffer memory 1440 may include one or more semiconductor devices in accordance with embodiments of the present disclosure. The buffer memory 1440 may include a plurality of first lines extending in a first direction; a plurality of second lines extending in a second direction crossing the first direction; a resistance variable layer interposed between the first lines and the second lines, and overlapping with at least each of intersection regions of the first lines and the second lines; a tunnel barrier layer interposed between the resistance variable layer and the first lines; and an intermediate electrode layer interposed between the resistance variable layer and the tunnel barrier layer, wherein each of the tunnel barrier layer and the intermediate electrode layer overlaps with each of the first lines, and is divided into two or more portions in the first direction. As a result, data storage characteristics of the buffer memory 1440 may be improved, fabrication processes may be simplified, and fabrication costs of the buffer memory 1440 may be reduced. In addition, operating characteristics of the memory system 1400 may be improved.

The buffer memory 1440 may further include a volatile memory, such as an SRAM (static random access memory), a DRAM (dynamic random access memory), or the like, and/or a nonvolatile memory, such as a phase change random access memory (PRAM), a resistive random access memory (RRAM), a spin transfer torque random access memory (STTRAM), a magnetic random access memory (MRAM), or the like.

In another embodiment, the buffer memory 1440 may not include a semiconductor device according to an embodiment of the present disclosure. Instead, the buffer memory 1440 only includes the volatile memory and/or the nonvolatile memory while another memory of the system includes a semiconductor device in accordance with an embodiment.

Electronic devices or systems shown in FIGS. 8 to 12 include one or more semiconductor devices according to embodiments of the present disclosure. As illustrated by FIGS. 8 to 12, embodiments may be implemented in various devices, systems or applications, including mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities, and so on.

While the present disclosure describes many embodiments, these should not be construed as limitations on the scope of any invention that may be claimed, but rather, as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in the present disclosure should not be understood as requiring such separation in all embodiments.

Only a few implementations and examples are described. Other implementations, enhancements and variations can be made based on what is described and illustrated in the present disclosure.

What is claimed is:

1. An electronic device including a semiconductor memory, the semiconductor memory comprising:
   a plurality of first lines extending in a first direction;
   a plurality of second lines extending in a second direction crossing the first direction;
   a resistance variable layer interposed between the first lines and the second lines, and overlapping with at least one of a plurality of intersection regions defined by the first lines and the second lines;
   a tunnel barrier layer interposed between the resistance variable layer and the first lines; and
   an intermediate electrode layer interposed between the resistance variable layer and the tunnel barrier layer,
   wherein each of the tunnel barrier layer and the intermediate electrode layer overlaps with each of the first lines, and is divided into two or more portions in the first direction, and
   wherein each of the two or more portions overlaps with at least two neighboring intersection regions of the plurality of intersection regions and a region between the two neighboring intersection regions.

2. The electronic device according to claim 1, wherein a number of intersection regions overlapping with each of the two or more portions is smaller than a number of intersection regions overlapping with each of the first lines.

3. The electronic device according to claim 1, wherein a width of each of the two or more portions is smaller than a width of each of the first lines, in the first direction.

4. The electronic device according to claim 1, wherein a width of each of the two or more portions is substantially the same as a width of each of the first lines, in the second direction.

5. The electronic device according to claim 1, wherein a planar shape of the tunnel barrier layer is substantially the same as a planar shape of the intermediate electrode layer.

6. The electronic device according to claim 1, wherein the resistance variable layer includes a plurality of resistance variable elements each of which has an island configuration and overlaps with a corresponding one of the plurality of intersection regions defined by the first lines and the second lines.

7. The electronic device according to claim 1, wherein the resistance variable layer has a plate shape and overlaps with all of the intersection regions defined by the first lines and the second lines.

8. The electronic device according to claim 1, wherein the resistance variable layer has a line shape and overlaps with each of the first lines or each of the second lines.

9. The electronic device according to claim 1, wherein the resistance variable layer has a resistance that changes depending on whether or not a current path is created therein.

10. The electronic device according to claim 1, wherein the tunnel barrier layer is formed of a dielectric material which has a larger energy band gap than an energy band gap of the resistance variable layer.

11. The electronic device according to claim 1, wherein a thickness of the tunnel barrier layer is increased as a planar area of each of the tunnel barrier layer and the intermediate electrode layer is increased.

12. The electronic device according to claim 1, wherein operating voltages applied to the first lines and the second lines are decreased as a planar area of each of the tunnel barrier layer and the intermediate electrode layer increases.

13. The electronic device according to claim 1, wherein the semiconductor memory further comprising:
    a selection element layer interposed between the resistance variable layer and the first lines.

14. The electronic device according to claim 13, wherein the selection element layer comprises a metal-insulator transition (MIT) element layer.

15. The electronic device according to claim 1, further comprising a microprocessor which includes:
    a controller configured to receive a signal including a command from outside of the microprocessor, and perform extracting and decoding of the command and controlling of input or output of a signal of the microprocessor;
    an operation unit configured to perform an operation based on a decoded command from the controller; and
    a memory configured to store data for performing the operation, data corresponding to a result of the operation, or an address of data for which the operation is performed,
    wherein the semiconductor memory is part of the memory in the microprocessor.

16. The electronic device according to claim 1, further comprising a processor which includes:
    a core unit configured to perform, based on a command inputted from outside of the processor, an operation corresponding to the command, by using data;
    a cache memory configured to store data for performing the operation, data corresponding to a result of performing the operation, or an address of data for which the operation is performed; and
    a bus interface connected between the core unit and the cache memory, and configured to transmit data between the core unit and the cache memory,
    wherein the semiconductor memory is part of the cache memory in the processor.

17. The electronic device according to claim 1, further comprising a processing system which includes:
    a processor configured to decode a command received by the processor and control an operation based on a result of decoding the command;
    an auxiliary memory device configured to store a program for decoding the command and the information;
    a main memory device configured to call and store the program and information from the auxiliary memory device such that the processor can perform the operation using the program and the information when executing the program; and an interface device configured to perform communication between at least one of the processor, the auxiliary memory device and the main memory device and an external device, wherein the semiconductor memory is part of the auxiliary memory device or the main memory device in the processing system.

18. The electronic device according to claim 1, further comprising a data storage system which includes:
a storage device configured to store data and conserve stored data regardless of power supply;
a controller configured to control input and output of data to and from the storage device according to a command inputted from an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

19. The electronic device according to claim 1, further comprising a memory system which includes:
a memory configured to store data and conserve stored data regardless of power supply;
a memory controller configured to control input and output of data to and from the memory according to a command inputted from an external device;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

* * * * *